US005722837A

United States Patent [19]

Kurahashi

[11] Patent Number: 5,722,837

[45] Date of Patent: Mar. 3, 1998

[54] COAXIAL CABLE CONNECTOR

[75] Inventor: Yoshio Kurahashi, Kanagawa, Japan

[73] Assignee: Emuden Musen Kogyo Kabushiki Kaisha, Kanagawa, Japan

[21] Appl. No.: 676,193

[22] PCT Filed: Nov. 17, 1995

[86] PCT No.: PCT/JP95/02357

§ 371 Date: Oct. 11, 1996

§ 102(e) Date: Oct. 11, 1996

[87] PCT Pub. No.: WO96/16454

PCT Pub. Date: May 30, 1996

[30] Foreign Application Priority Data

Nov. 17, 1994 [JP] Japan .................................... 6-283396

[51] Int. Cl.[6] .................................................... H05K 1/00

[52] U.S. Cl. ............................................. 439/63; 439/581

[58] Field of Search ............................ 439/63, 581, 675, 439/578, 579, 580, 92, 95, 939

[56] References Cited

U.S. PATENT DOCUMENTS

| | | | |
|---|---|---|---|
| 4,846,719 | 7/1989 | Iwashita | 439/63 |
| 4,904,206 | 2/1990 | Laudig et al. | 439/578 |
| 5,062,811 | 11/1991 | Hackman | 439/620 |
| 5,100,344 | 3/1992 | Truong | 439/578 |
| 5,145,412 | 9/1992 | Tan et al. | 439/620 |
| 5,478,258 | 12/1995 | Wang | 439/581 |
| 5,482,477 | 1/1996 | Michael | 439/63 |
| 5,641,294 | 6/1997 | Beard | 439/63 |

FOREIGN PATENT DOCUMENTS 61-65680 5/1986 Japan .

*Primary Examiner*—Gary F. Paumen
*Assistant Examiner*—Tho Dac Ta
*Attorney, Agent, or Firm*—Morrison Law Firm

[57] ABSTRACT

An insulating base includes integrally formed raised supporting portions, bridging portions, and a contact holding portion formed between the bridging portions. One end of the contact holding portion projects through a mounting hole of the insulating base to connect with a conductive cover, while another end of the contact holding portion connects with a contact terminal. The contact holding portion and the conductive cover together receive a coaxial cable plug. A fitting portion of the cover fits between an inner surface of the mounting hole and an outer surface of the contact holding portion. A mounting collar on the cover contacts the insulating base at an edge of the mounting hole. A stopper groove on the fitting portion of the cover is located on the other side of the insulating base from the mounting collar. A catching portion of a ground contact terminal, shaped as a two-pronged fork, engages the stopper groove to securely attach the cover to the insulating base while simultaneously connecting the ground contact terminal to the conductive cover.

13 Claims, 2 Drawing Sheets

COAXIAL CABLE CONNECTOR

BACKGROUND OF THE INVENTION

The present invention relates to a coaxial cable connector which is easier to produce and assemble and is capable of reducing the number of parts, wherein its cover is attached by engaging a ground contact terminal with the cover.

A typical configuration of a coaxial cable connector of this type requires the steps of (1) inserting a plug contact portion of a contact terminal in a plug contact portion insertion hole, which is so bored in a cylindrical insulating bush for maintaining the contact as to extend along the axis of the insulating bush; (2) inserting the insulating bush having the contact terminal inserted therein into a conductive cover; (3) holding another insulating bush that is inserted in the conductive cover by means of crimping the cover; (4) fitting the conductive cover in a mounting hole of the base; (5) attaching the conductive cover to the base while the base is sandwiched, at the upper and the lower ends of the mounting hole thereof, by a mounting collar of the conductive cover and a nut screwed around a threaded portion of the conductive cover; and (6) fastening a ground contact terminal with a nut in the state where the ground contact terminal is fitted to the conductive cover which is snugly inserted in the base.

However, the above configuration of the conventional coaxial cable connector requires fitting the conductive cover, which maintains the contact through the insulating bushes, in the mounting hole of the base, then fitting the ground contact terminal to the conductive cover, and finally screwing a nut around the threaded portion of the conductive cover. As the conventional configuration requires a large number of parts and assembling steps, it presents such problems as poor productivity and high production costs.

An example of a means for solving this problem is offered in Japanese Utility Model Publication No. 13344/1989, which discloses a coaxial cable connector having a conductive cover and a ground contact terminal. The conductive cover has a mounting collar that juts out from the middle of the outer surface of the conductive cover and a stopper groove formed below the mounting collar. The ground contact terminal has a forked catching piece portion to be fitted in the stopper groove of the conductive cover, wherein the cover can be attached to a base of the coaxial cable connector by means of fitting the conductive cover in a mounting hole of the base. The mounting collar is thereby brought into contact with the upper end of the mounting hole. The catching piece portion of the ground contact terminal is then fitted in the stopper groove that is now located below the underside of the base as a result of the insertion of the cover through the mounting hole of the base so that the base is firmly sandwiched between the mounting collar and the ground contact terminal.

The configuration of the coaxial cable connector disclosed in the above Japanese Utility Model Publication No. 13344/1989, however, requires a particular process to secure an insulating bush in the conductive cover in order to insulate a plug contact portion of the contact terminal from the cover. Furthermore, the configuration of the conductive cover is complicated in that a positioning step has to be formed in the conductive cover in order to secure the insulating bush.

OBJECTS AND SUMMARY OF THE INVENTION

In order to solve the above problems, an object of the present invention is to provide a coaxial cable connector which is easier to produce and assemble.

Another object of the present invention is to provide a cable connecter with fewer parts.

Briefly stated, an insulating base includes integrally formed raised supporting portions, bridging portions, and a contact holding portion formed between the bridging portions. One end of the contact holding portion projects through a mounting hole of the insulating base to connect with a conductive cover, while another end of the contact holding portion connects with a contact terminal. The contact holding portion and the conductive cover together receive a coaxial cable plug. A fitting portion of the cover fits between an inner surface of the mounting hole and an outer surface of the contact holding portion. A mounting collar on the cover contacts the insulating base at an edge of the mounting hole. A stopper groove on the fitting portion of the cover is located on the other side of the insulating base from the mounting collar. A catching portion of a ground contact terminal, shaped as a two-pronged fork, engages the stopper groove to securely attach the cover to the insulating base while simultaneously connecting the ground contact terminal to the conductive cover.

According to an embodiment of the present invention, a coaxial cable connector includes an insulating base, a conductive cover fitting into the insulating base through a mounting hole in the insulating base, the conductive cover effective for receiving a ground terminal portion of a coaxial cable, a stopper groove in the conductive cover, the stopper groove being effective for receiving a catching portion of a ground contact terminal, a contact holding portion connected to the insulating base, the contact holding portion having a plug pin insertion hole at one end thereof effective for receiving a plug pin of a coaxial connector, the contact holding portion having a plug contact portion insertion hole at another end thereof effective for receiving a plug contact portion of a contact terminal, and the plug pin insertion hole and the plug contact portion insertion hole directly communicating with each other.

According to an embodiment of the present invention, a coaxial cable connector includes an insulating base, a conductive cover fitting into the insulating base through a mounting hole in the insulating base, means, in the conductive cover, for receiving a ground terminal portion of a coaxial cable, means, in the conductive cover, for receiving a catching portion of a ground contact terminal, a contact holding portion connected to the insulating base, means, in one end of the contact holding portion, for receiving a plug pin of a coaxial connector, means, in another end of the contact holding portion, for receiving a plug contact portion of a contact terminal, and the means for receiving a plug pin of a coaxial connector and the means for receiving a plug contact portion of a contact terminal being in direct communication with each other.

According to an embodiment of the present invention, a method of assembling a coaxial cable connector includes the steps of fitting a cover in a mounting hole of a mounting base 1 wherein a mounting collar of the cover contacts the mounting base at an edge of the mounting hole, fitting a catching portion of a ground contact terminal into a stopper groove of the cover wherein the mounting base is sandwiched between the mounting collar and the ground contact terminal, and inserting a contact terminal into a contact holding portion of the mounting base.

The present invention relates to a coaxial cable connector having an insulating base; a cylindrical conductive cover to be attached to the insulating base; a ground contact terminal which is provided with a catching portion to be engaged with and connected to the conductive cover; and a contact terminal which is provided with a plug contact portion to be insulated and snugly inserted into the conductive cover; wherein at least one mounting hole for permitting the conductive cover to be inserted therethrough is bored through the insulating base; raised supporting portions jutting downward from the edge of the mounting hole, bridging portions that connect the raised supporting portions, and a contact holding portion are provided as an integral body with the insulating base in such a manner that the contact holding portion is inserted through the mounting hole so as to project above the insulating base; the contact holding portion is provided with an insertion hole for a plug pin of a coaxial connector and a plug contact portion insertion hole for the plug contact portion of the contact terminal to be inserted therein, the plug pin insertion hole and the plug contact portion insertion hole directly communicating with each other and respectively opened at the upper end and the lower end of the contact holding portion; a fitting portion to be fitted between the inner surface of the mounting hole of the insulating base and the outer surface of the contact holding portion is formed at the lower part of the conductive cover; a horizontally jutting mounting collar to contact with the upper end of the mounting hole is formed at the upper end of the fitting portion; a stopper groove is formed below the mounting collar; the catching portion of the ground contact terminal is formed in the shape of a two-pronged fork so as to be fitted in the stopper groove of the conductive cover; the conductive cover is attached to the insulating base by means of fitting the conductive cover around the contact holding portion of the insulating base, inserting the fitting portion of the conductive cover between the inner surface of the mounting hole of the insulating base and the outer surface of the contact holding portion so that the mounting collar comes into contact with the upper end of the mounting hole, and fitting the catching piece portion of the ground contact terminal in the stopper groove of the conductive cover located below the underside of the insulating base in the state where the conductive cover is inserted through the mounting hole of the insulating base, thereby securely supporting the insulating base between the mounting collar and the ground contact terminal; and the plug contact portion of the contact terminal is securely inserted in the contact holding portion of the insulating base. With the configuration as above, the cover can be attached to the base by inserting the plug contact portion of the contact terminal into the plug contact portion insertion hole of the contact holding portion, which is an integral body with the base, inserting the conductive cover through the mounting hole of the base by fitting the cover around the contact holding portion, and sandwiching the base between the mounting collar and the ground contact terminal by bringing the mounting collar into contact with the upper end of the mounting hole and fitting the ground contact terminal in the stopper groove of the cover, which is located below the underside of the base because of the insertion of the cover through the mounting hole. The plug contact portion may be inserted into the plug contact portion insertion hole of the contact holding portion after the cover is attached to the base. The contact holding portion and the base of the coaxial cable connector assembled as above are formed as an integral body. As there is no need of a working step to fit an insulating bush in the conductive cover, and the number of parts is reduced, a coaxial cable connector according to the invention is more convenient to assemble.

According to another feature of the invention, rotation-stop catching surfaces are formed on the inner surface of the mounting hole of the insulating base, and rotation-stop surfaces which come into contact with the rotation-stop catching surfaces are formed on the fitting portion of the conductive cover. Therefore, by bringing the rotation stop surfaces of the fitting portion of the cover into the rotation-stop catching surfaces on the inner surface of the mounting hole of the insulating base, the cover is secured so as not to turn in the circumferential direction.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
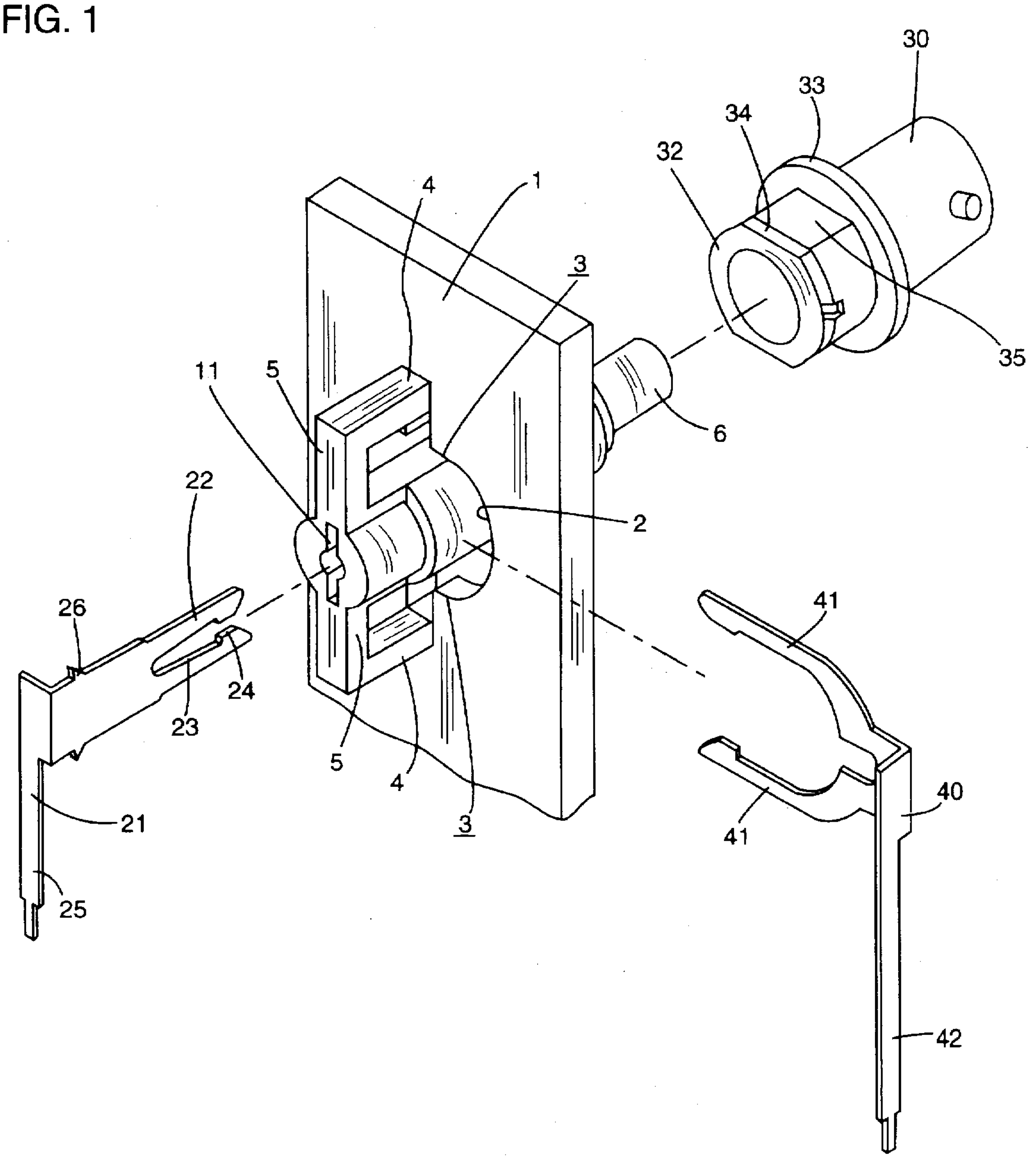
FIG. 1 is an exploded oblique view of a coaxial cable connector according to an embodiment of the present invention.
Figure 2:
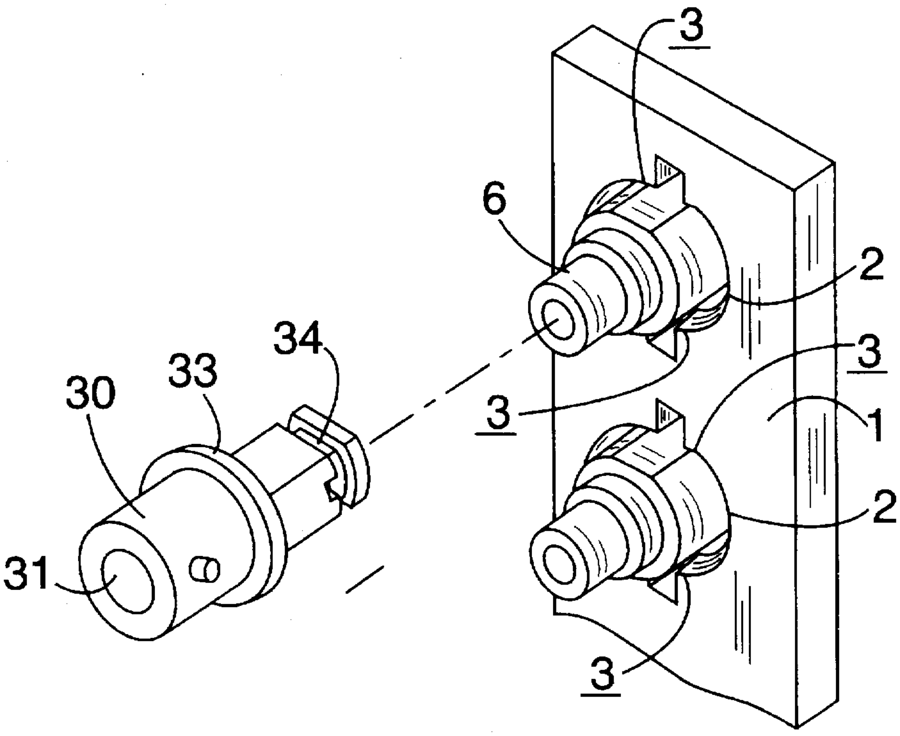
FIG. 2 is an exploded oblique view of the embodiment of FIG. 1 viewed from the opposite side.
Figure 3:
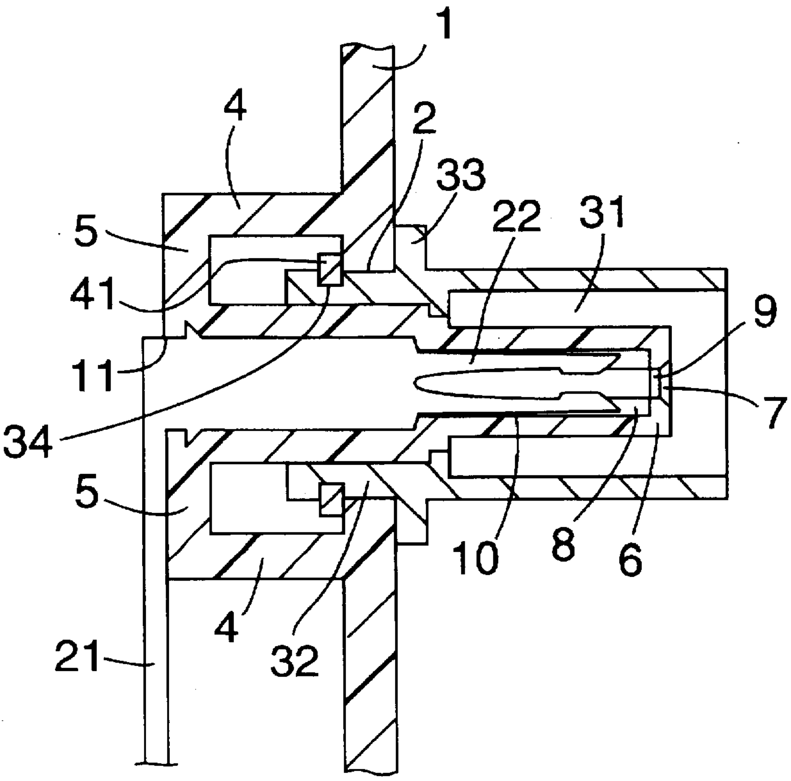
FIG. 3 is a vertical sectional view of the embodiment of FIG. 1 in the assembled state.

Referring to FIGS. 1–3, a mounting base 1 is formed in the shape of a plate using an insulating material, such as synthetic resin. Mounting base 1 preferably has appropriate projections (not shown) and/or mounting holes to facilitate attaching mounting base 1 to a housing or the like.

One or more mounting holes 2 are bored through the planar surface of mounting base 1. Each mounting hole 2 is preferably formed by boring two overlapping circular holes with offset centers. The two lines tangent to both circles (holes) defines two remaining portions which are then removed to form two rotation-stop catching surfaces 3, 3. Each mounting hole 2 is thus roughly oblong in shape with opposing planar sides forming the rotation-stop catching surfaces 3, 3.

Raised supporting portions 4, 4 are preferably integrally formed with mounting base 1. Raised supporting portions 4, 4 jut outward from the perimeter of mounting hole 2, i.e., facing towards the left of FIG. 1. The ends of raised supporting portions 4, 4 are connected by bridging portions 5, 5 and an essentially cylindrical contact holding portion 6. Contact holding portion 6 is provided between bridging portions 5, 5 in such a manner as to project beyond mounting base 1. Raised supporting portions 4, 4; bridging portions 5, 5; and contact holding portion 6 are preferably formed as a single body.

A contact terminal 21 is formed of a conductive plate. One end of contact terminal 21 includes a plug contact portion 22 which has a plug pin catching notch 23 open at an end for receiving a coaxial cable plug pin. A contact-point portion 24, which becomes narrower towards the end, protrudes inward from the end of each side of plug pin catching notch 23 so that the two contact-point portions 24 face each other. Plug pin catching notch 23 and contact-point portions 24 thus provide resilient contact with the received coaxial cable plug pin.

The other end of contact terminal 21 extends straight, thus forming a connecting piece 25 for connecting to a conductive wire (not shown). A catching protrusion 26, shaped in an inverted V, is formed at the middle of each side edge of contact terminal 21 to provide a firm connection when inserted into a groove-shaped plug contact portion insertion hole 11. Plug contact portion insertion hole 11 is open at one end so as to permit plug contact portion 22 of contact terminal 21 to be inserted therein.

A cover 30 is formed of conductive material, such as metal, in an essentially cylindrical shape. A fitting hole 31 permitting contact holding portion 6 to be fitted therein is coaxially bored through cover 30. A fitting portion 32 of fitting hole 31 has a smaller diameter than a remainder of fitting hole 31 so as to fit between an inner surface of mounting hole 2 of mounting base 1 and an outer surface of contact holding portion 6. A mounting collar 33 horizontally juts out from one end of fitting portion 32 to limit movement of cover 30 through mounting hole 2.

Substantially flat rotation-stop surfaces 35 are formed on fitting portion 32 of cover 30 so as to contact rotation-stop catching surfaces 3 when cover 30 is inserted into mounting hole 2. A stopper groove 34 is located near an end of fitting portion 32 effective for receiving a catching portion 41 of an essentially L-shaped ground contact terminal 40. A connecting piece portion 42 of ground contact terminal 40 attaches to a ground wire (not shown). Catching portion 41 is in the shape of a U-like fork which fits in catching groove 34 of cover 30.

A plug pin insertion hole 10 for receiving a coaxial cable plug pin (not shown) is coaxially bored in contact holding portion 6. A tapered insertion portion 7 of plug pin insertion hole 10 facilitates entry of the coaxial cable plug pin (not shown). Tapered insertion portion 7 is connected to a main insertion portion 8 by a step portion 9. Main insertion portion 8 tapers gently away from step portion 9. Plug pin insertion hole 10 directly communicates with plug contact portion insertion hole 11.

The procedure for assembling the present embodiment is explained hereunder.

First, insert plug contact portion 22 of contact terminal 21 into plug contact portion insertion hole 11 of contact holding portion 6 until catching protrusions 26 of contact terminal 21 are caught in plug contact portion insertion hole 11.

Second, fit cover 30 over contact holding portion 6, which has contact terminal 21 inserted therein, so that contact holding portion 6 is inside fitting hole 31 of cover 30. By fitting cover 30 in a manner such that rotation-stop catching surfaces 3 of mounting hole 2 are positioned to correspond to rotation-stop surfaces 35, fitting portion 32 of cover 30 is pushed between the outer surface of contact holding portion 6 and inner surface of mounting hole 2 of mounting base 1. Mounting collar 33 of cover 30 comes into contact with the upper surface of mounting base 1. In this state, cover 30 is secured with its rotation-stop surfaces 35 abutting respective rotation-stop catching surfaces 3 of mounting hole 2.

Third, snugly attach cover 30 to mounting base 1 by fitting catching portion 41 of ground contact terminal 40 in stopper groove 34 of cover 30. Mounting collar 33 and ground contact terminal 40 securely sandwiches mounting base 1. Since cover 30 is secured against turning by the engagement of rotation-stop surfaces of cover 30 with rotation-stop catching surfaces of the mounting hole, stable connection of a coaxial cable plug is ensured.

Optionally, plug contact portion 22 may be inserted into plug contact portion insertion hole 11 of contact holding portion 6 after cover 30 is attached to mounting base 1.

Furthermore, although connecting piece portion 25 of contact terminal 21 and connecting piece portion 42 of ground contact terminal 40 project perpendicular to mounting base 1 in the above embodiment, they may be so formed as to project parallel to mounting base 1.

Contact holding portion 6 projects from mounting base 1 and permits contact terminal 21 to be inserted therein. Therefore, the connector is easily assembled by fitting cover 30 in mounting hole 2 of mounting base 1 to bring mounting collar 33 of cover 30 into contact with the upper end of mounting hole 2, fitting catching portion 41 of ground contact terminal 40 in a stopper groove of cover 30 in the state where cover 30 is fitted through mounting hole 2 of mounting base 1 so that the portion where the stopper groove is formed projects downward from the mounting hole, attaching cover 30 to mounting base 1 with mounting base 1 sandwiched between mounting collar 33 and ground contact terminal 40, and inserting contact terminal 21 into contact holding portion 6. Thus, the invention provides a connector which requires only a minimal number of parts, is easier to assemble, is of better quality and has lower production costs than the prior art.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A coaxial cable connector, comprising:

an insulating base;

a conductive cover fitting into said insulating base through a mounting hole in said insulating base;

said conductive cover being effective for receiving a ground terminal portion of a coaxial cable;

a stopper groove in said conductive cover;

said stopper groove being effective for receiving a catching portion of a ground contact terminal;

a contact holding portion connected to said insulating base;

said contact holding portion having a plug pin insertion hole at one end thereof being effective for receiving a plug pin of a coaxial connector;

said contact holding portion having a plug contact portion insertion hole at another end thereof being effective for receiving a plug contact portion of a contact terminal; and said plug pin insertion hole and said plug contact portion insertion hole directly communicating with each other.

2. A coaxial cable connector according to claim 1, wherein:

at least one rotation-stop catching surface is formed on an inner surface of said mounting hole;

at least one rotation-stop surface is formed on said conductive cover; and said at least one rotation-stop catching surface and said at least one rotation-stop surface are congruent to each other.

3. A coaxial cable connector according to claim 1, wherein said conductive cover further comprises:

a fitting portion being effective for fitting between an inner surface of said mounting hole and an outer surface of said contact holding portion;

said stopper groove being in said fitting portion; and an annular mounting collar separating said fitting portion from a remainder of said conductive cover.

4. A coaxial cable connector according to claim 1, further comprising:

a plurality of raised supporting portions jutting from said insulating base at an edge of said mounting hole; and a bridging portion connecting said plurality of raised supporting portions to each other and to said contact holding portion.

5. A coaxial cable connector according to claim 4, wherein said plurality of raised supporting portions, said bridging portion, and said contact holding portion are integrally formed.

6. A coaxial cable connector according to claim 4, wherein said plurality of raised supporting portions, said bridging portion, said contact holding portion, and said insulating base are integrally formed.

7. A coaxial cable connector according to claim 1, further comprising:

said contact terminal; and said ground contact terminal.

8. A coaxial cable connector according to claim 7, wherein:

said contact terminal includes a plug contact portion, a plug pin catching notch, a catching protrusion, and a connecting piece; and said ground contact terminal includes a catching portion and a connecting piece portion.

9. A coaxial cable connector, comprising:

an insulating base;

a conductive cover fitting into said insulating base through a mounting hole in said insulating base;

means, in said conductive cover, for receiving a ground terminal portion of a coaxial cable;

means, in said conductive cover, for receiving a catching portion of a ground contact terminal;

a contact holding portion connected to said insulating base;

means, in one end of said contact holding portion, for receiving a plug pin of a coaxial connector;

means, in another end of said contact holding portion, for receiving a plug contact portion of a contact terminal; and said means for receiving a plug pin of a coaxial connector and said means for receiving a plug contact portion of a contact terminal being in direct communication with each other.

10. A coaxial cable connector according to claim 9, further comprising means for preventing rotation of said conductive cover inside said mounting hole.

11. A method of assembling a coaxial cable connector, comprising the steps of:

fitting a cover in a mounting hole of a mounting base wherein a mounting collar of said cover contacts said mounting base at an edge of said mounting hole;

fitting a catching portion of a ground contact terminal into a stopper groove of said cover wherein said mounting base is sandwiched between said mounting collar and said ground contact terminal; and inserting a contact terminal into a contact holding portion of said mounting base.

12. A method according to claim 11, further comprising the step of attaching a catching protrusion of said contact terminal to said contact holding portion.

13. A method according to claim 11, further comprising the steps of:

forming at least one rotation-stop catching surface in said mounting hole; and forming at least one rotation-stop surface on said cover, said at least one rotation-stop surface being substantially congruent to said at least one rotation-stop catching surface.

* * * * *